United States Patent [19]

Fukuhara et al.

[11] Patent Number: 4,687,931

[45] Date of Patent: Aug. 18, 1987

[54] SCANNING ELECTRON MICROSCOPE

[75] Inventors: Satoru Fukuhara, Kokubunji; Hideo Todokoro, Nitshitama, both of Japan

[73] Assignee: Hitachi, Ltd., Tokyo, Japan

[21] Appl. No.: 857,234

[22] Filed: Apr. 29, 1986

[30] Foreign Application Priority Data

May 7, 1985 [JP] Japan .................................. 60-95441

[51] Int. Cl.$^4$ ........................ H01J 37/28; H01J 37/20
[52] U.S. Cl. ................................ 250/310; 250/442.1; 250/318
[58] Field of Search ...................... 250/442.1, 310, 398, 250/311, 492.2, 492.22; 219/121 EX, 121 EY; 350/531, 520, 507

[56] References Cited

U.S. PATENT DOCUMENTS 4,233,510  11/1980  Sato ..................................... 250/310
4,393,309   7/1983  Norioka ............................. 250/310

Primary Examiner—Craig E. Church
Assistant Examiner—Jack I. Berman
Attorney, Agent, or Firm—Antonelli, Terry & Wands

[57] ABSTRACT

Herein disclosed is a scanning electron microscope in which an electron beam is finely focused into a small beam diameter and irradiated on a specimen so that the focused electron beam may scan two-dimensionally to obtain an image with signals of secondary electrons generated from the specimen. The scanning electron microscope is equipped with means for making the moving speed of a specimen stage, which is movable two-dimensionally in response to electric control signals, automatically variable in association with the magnification of the image.

3 Claims, 3 Drawing Figures

SCANNING ELECTRON MICROSCOPE

BACKGROUND OF THE INVENTION

The present invention relates to a scanning electron microscope and, more particularly, to a scanning electron microscope which is equipped with proper means for controlling the moving speed of a specimen stage.

Heretofore, many scanning electron microscopes have been used in medical and biological fields mainly with a view to observing the microscopic shapes of specimens. In recent years, however, the scanning electron microscopes have rapidly come to be used as an apparatus for observing the patterns of IC, LSI and so on in the semiconductor industry. In accordance with this use, it has become necessary to set the two-dimensional coordinates, i.e., X- and Y-coordinates of the specimens because specimens of IC, LSI, etc., have many identical patterns on their wafers or chips. That necessity cannot be coped with any more by the prior art manual movement of the specimen stage. In view of this, therefore, the specimen stage movement is being executed with high accuracy in response to electric signals by using a pulse motor or servomotor. As is disclosed in Japanese Patent Laid-Open No. 55-95113, there is an example in which the movement of the specimen stage is executed by electric control using a pulse motor.

In case the specimen stage movement is applied to the scanning electron microscope (which will be shortly referred to as "SEM"), however, it should be noted that the magnification of the scanning electron microscope varies over a wide range of about 20 to 500,000 times. This means that the moving speed of the specimen stage is low for a small magnification but high for a large magnification on the SEM image on a cathode ray tube (which will be shortly referred to as "CRT", as customary) being observed, if it is kept constant, thus raising a problem that the SEM cannot operate to observe the SEM image and execute location of a point while moving the specimen stage bit by bit.

SUMMARY OF THE INVENTION

An object of the present invention is to provide a scanning electron microscope which can keep constant the moving speed of the SEM image on the CRT being observed even if the magnification of SEM image varies over a wide range from a small one to a large one.

According to the present invention, the above-specified object can be achieved by means of a scanning electron microscope comprising: electron beam focusing means for focusing and irradiating a focused electron beam on a specimen; deflecting means for two-dimensional scanning of said electron beam; detecting means for detecting a secondary electron signal generated from said specimen to form an image; moving means for two-dimensional movement of a specimen stage on which said specimen is carried; and control means making variable the speed of two-dimensional movement of said specimen stage in association with the magnification of said image by controlling said moving means in accordance with an electric control signal.

In case of the scanning electron microscope, not the actual moving speed V (mm/sec) on the specimen stage but the moving speed V* (mm/sec) of the SEM image on the CRT being observed plays an important role. The latter moving speed V* of the SEM image on the CRT relates to the magnification M of the SEM image of the scanning electron microscope and is expressed by $V^* = M \cdot V$. Therefore, the SEM image can be observed always at a constant moving speed independent of its magnification if the moving speed V of the specimen stage can be so varied in accordance with the change in the magnification that the moving speed V* be maintained constant.

DESCRIPTION OF THE PREFERRED EMBODIMENT

Figure 1:
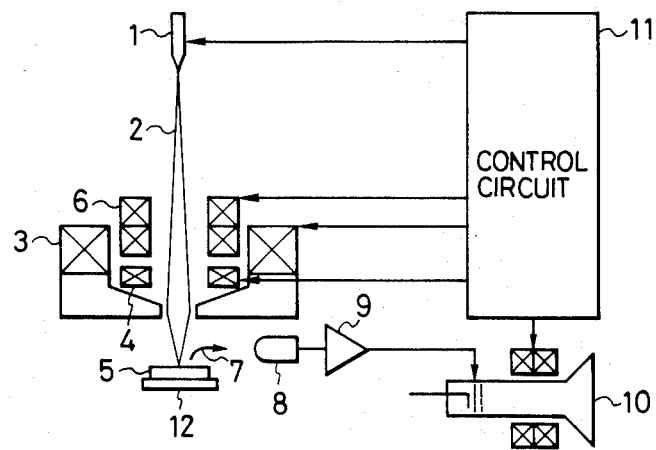
FIG. 1 is a schematic diagram showing the construction of a scanning electron microscope according to one embodiment of the present invention.

The present invention will be described in the following with reference to the accompanying drawings In FIG. 1 showing a scanning electron microscope, primary electrons 2 emitted from a cathode 1 are finely focused into a small beam and irradiated on a specimen 5 by the actions of an objective lens 3 and an astigmatism correction coil 4. At the same time, the electron beam is caused to scan the surface of the specimen 5 by the action of an X-Y deflecting coil 6. Secondary electrons 7 are emitted from the specimen 5 and are detected by a secondary electron detector 8. The secondary electrons 7 thus detected are amplified to a predetermined voltage level through a preamplifier 9 and are then input as a luminance signal to a display 10. Here, the scanning operation on the display 10 is synchronized with the X-Y deflection coil 6 so that the secondary electron image in the scanned area of the specimen 5 can be observed on the display 10. Thus, an image of several microns on the scanned area of the specimen 5 can be magnified to a range of several tens cm and displayed on the scope of the display 10. A control circuit 11 includes a variety of circuits such as current sources for the individual coils 3, 4 and 6, a high-voltage power source for accelerating the primary electrons 2 to the cathode 1, or a magnification switching circuit for determining the magnification of the image.

In the prior art, the movement of the area being observed is executed by manual and mechanical movement of a specimen stage 12 in the X- and Y-directions.

Figure 2:
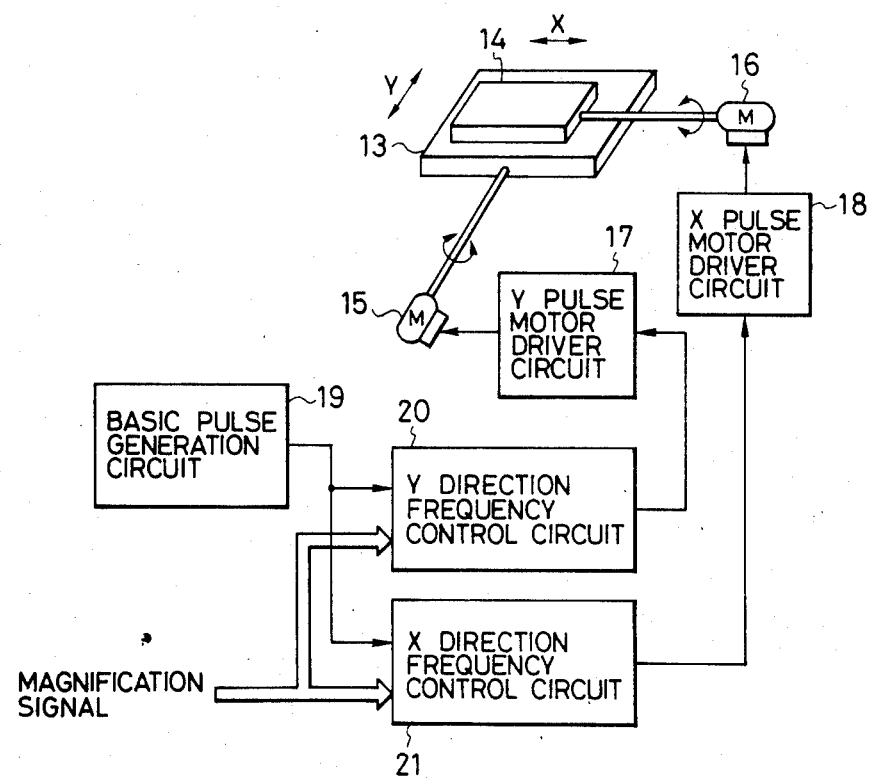
FIG. 2 is a block diagram showing a specimen stage and a moving mechanism of the former shown in FIG. 1.

As shown in FIG. 2, the specimen stage 12 of the scanning electron microscope according to the present embodiment is composed of a Y-stage 13 and an X-stage 14, which are controlled by independent pulse motors 15 and 16, respectively. The moving speed V of the X- and Y-stages 13 and 14 can be determined in accordance with the repeated frequency of pulses to be input to driver circuits 17 and 18 of the pulse motors 15 and 16. It follows that the pulse repeat frequency may be controlled to be high if a high-speed movement is to be executed and to be low for a low-speed movement. Those pulses are oscillated by a basic pulse generation circuit 19 and are made variable in proportion to the magnification signal of a magnification switching circuit present by the side of the body of the scanning electron microscope by the actions of frequency control circuits 20 and 21.

Figure 3:
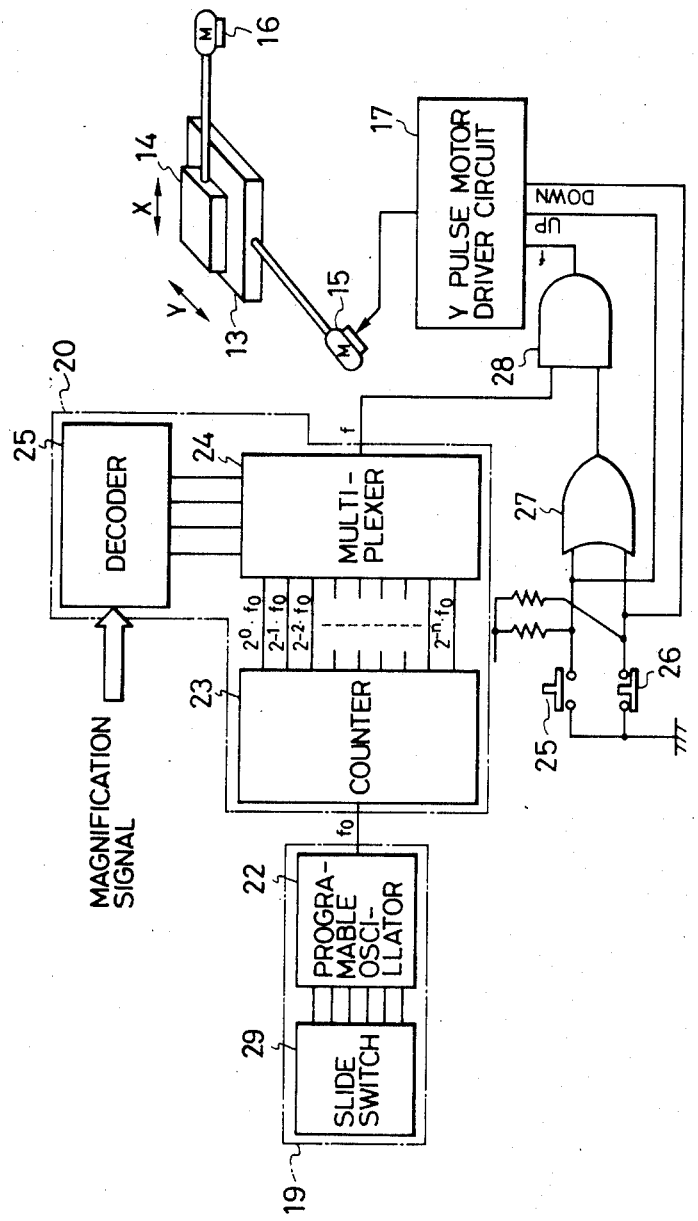
FIG. 3 is a circuit diagram showing an embodiment of the moving mechanism shown in FIG. 2.

For a more detailed description, FIG. 3 is a diagram showing the basic pulse generation circuit 19 and the frequency control circuit 20 of the Y-stage 13. The X-stage 14 is absolutely identical to the Y-stage 13 in connection with those circuits. The present embodiment uses a programmable oscillator 22 as the basic pulse generation circuit 19. The pulse oscillator 22 is enabled to vary a pulse repetition frequency $f_0$ over a wide range from 1 MHz to 1/100 Hz by the selection of a slide switch 29. This makes it possible to determine the optimum moving speed $V^*$ of the SEM image while observing the SEM image. Now, if the oscillation frequency is set at $f_0$ Hz for the minimum magnification of the SEM image, e.g., 20 times, the oscillation pulses are subjected to a frequency division by the action of a counter 23 so that the individual pulses are input to a multiplexer 24. The resultant pulse repeated frequencies are $2^0 \cdot f_0$, $2^{-1} \cdot f_0$, $2^{-2} \cdot f_0$, - - -, and $2^{-n} \cdot f_0$. The multiplxer 24 is an element for selecting one of those pulses and is caused to execute its selecting operation in response to the magnification signal of the SEM image of the scanning electron microscope. The selection signal of the multiplexer 24 is so executed through a decoder 25 of the multiplexer 24 selects each of $2^0 \cdot f_0$, $2^{-1} \cdot f_0$, $2^{-2} \cdot f_0$, - - -, and $2^{-n} \cdot f_0$ when the magnification of the SEM image is varied to $20 \times 20^0$, $20 \times 20^1$, $20 \times 20^2$, $20 \times 20^3$, - - - and $20 \times 20^n$. As a result, the pulse repeat frequency is made lower in proportion to the magnification of the SEM image so that the moving speed of the Y-stage 13 is dropped.

Next, in case the Y-stage 13 is to be moved, either of two push buttons, i.e., an up button 25 and a down button 26 can be pushed to move the Y-stage 13 in the Y-direction. At the same time, the resultant signals are fed through two gate circuits 27 and 28 so that the pulse signal of the repeat frequency f is input to the Y-pulse motor driver circuit 17 only while the down button 26 is being pushed In response to those three signals, i.e., the pulse signal of the repeat frequency f and the up and down signals, the Y-pulse motor driver circuit 17 can remove the Y-stage 13 in an arbitrary direction and at an arbitrary speed.

If the magnification of the SEM image of the scanning electron microscope is denoted at M and if the moving speed of the Y-stage 13 is denoted at V (mm/S), the moving speed $V^*$ of the SEM image can be made constant by the construction thus far described, because the moving speed $V^*$ of the SEM image is expressed by $V^* = M \times V$.

Incidentally, the present invention has been described in connection with a scanning electron microscopic, but the present invention can naturally be applied to another charged corpuscular ray apparatus such as an ion microanalyzer.

Since the moving speed of the SEM image on the CRT being observed can be made constant independent of the magnification of the scanning electron microscope, according to the present invention, the positioning operation of the specimen stage and the image selection can be remarkably facilitated to improve the operability drastically.

What is claimed is:

1. A scanning electron microscope comprising: electron beam focusing means for focusing and irradiating a focused electron beam on a specimen; deflecting means for two-dimensionally scanning said electron beam; detecting means for detecting a secondary electron signal generated from said specimen to form an image; moving means for two-dimensionally moving a specimen stage on which said specimen is carried; and control means making variable the two-dimensional moving speed of said specimen stage in association with the magnification of said image by controlling said moving means in accordance with an electric control signal.

2. A scanning electron microscope according to claim 1, wherein said control means makes the moving speed V of said specimen stage so automatically variable in association with the magnification of said image as is expressed by $V^* = M.V =$ constant if: the moving speed of said specimen stage is denoted at V; the magnification of said image is denoted at M; and the moving speed of said image is denoted at $V^*$.

3. A scanning electron microscope according to claim 1, wherein said control means includes: a basic pulse generation circuit for generating pulses; a frequency control circuit for varying the frequency of the pulses of said basic pulse generation circuit in association with a magnification; and a pulse motor adapted to be driven in the frequency of the output of said frequency control circuit.

* * * * *